US008218363B2

(12) United States Patent
Kim et al.

(10) Patent No.: US 8,218,363 B2
(45) Date of Patent: Jul. 10, 2012

(54) FLASH MEMORY DEVICE AND METHODS PROGRAMMING/READING FLASH MEMORY DEVICE

(75) Inventors: Jaehong Kim, Seoul (KR); Hong-rak Son, Anyang-si (KR); Jun-jin Kong, Yongin-si (KR); Yoo-cheol Shin, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 347 days.

(21) Appl. No.: 12/697,542

(22) Filed: Feb. 1, 2010

(65) Prior Publication Data

US 2010/0195389 A1 Aug. 5, 2010

(30) Foreign Application Priority Data

Feb. 2, 2009 (KR) .................. 10-2009-0008039

(51) Int. Cl.
*G11C 16/04* (2006.01)
(52) U.S. Cl. ................ 365/185.03; 365/185.18
(58) Field of Classification Search .......... None
See application file for complete search history.

(56) References Cited

U.S. PATENT DOCUMENTS

| 7,259,987 B2 | 8/2007 | Chen et al. |
| 2008/0123406 A1 | 5/2008 | Ho et al. |
| 2008/0158954 A1 | 7/2008 | Hamilton et al. |
| 2009/0003080 A1* | 1/2009 | Noh .................. 365/185.25 |
| 2010/0046296 A1* | 2/2010 | Liao .................. 365/185.18 |

FOREIGN PATENT DOCUMENTS

KR 1020080029861 A 4/2008

* cited by examiner

*Primary Examiner* — Hoai V Ho
*Assistant Examiner* — James G Norman
(74) *Attorney, Agent, or Firm* — Volentine & Whitt, PLLC

(57) ABSTRACT

Multilevel flash memory and methods of programming/reading flash memory are disclosed. The multilevel flash memory device comprises a status detector configured to detect whether or not a target memory cell is programmed to an erase state, and a control logic unit controlling a program voltage applied to a neighboring memory cell adjacent to the target memory cell and to be programmed to one of a plurality of standard program states, such that the neighboring memory cell is programmed to a corresponding one of a plurality of correction program states different from the one of the plurality of standard program states.

20 Claims, 12 Drawing Sheets

FLASH MEMORY DEVICE AND METHODS PROGRAMMING/READING FLASH MEMORY DEVICE

CROSS-REFERENCE TO RELATED APPLICATIONS

This application claims the benefit of Korean Patent Application No. 10-2009-0008039 filed on Feb. 2, 2009, the subject matter of which is hereby incorporated by reference.

BACKGROUND

The inventive concept relates generally to semiconductor memory devices and flash memory devices in particularly. The inventive concept also relates to methods of programming/reading flash memory devices that address the problem program disturbance between adjacent memory cells.

Non-volatile memory is characterized by an ability to retain stored data in the absence of applied power. Flash memory is one type of non-volatile memory. Due to its high integration density, flash memory is commonly used in mobile devices such as cellular phones, personal digital assistant (PDA) digital cameras, portable game consoles, and M(P3) players. Flash memory is also used in home applications such as high definition televisions (HDTVs), digital versatile discs (DVDs), routers, and global positioning system (GPS) devices. Within these and other types of consumer electronics, flash memory is used to store programming code and/or payload (or user) data.

Flash memory may be provided with single level (SLC) memory cells or multi level cell (MLC) memory cells. Within MLC flash memory, it is important to secure the reliability of the multi-bit data stored in each memory cell. In this regard, the programming errors potentially arising from the so-called "program disturb" phenomenon must be addressed.

SUMMARY

Embodiments of the inventive concept provide flash memory devices and methods of programming/reading flash memory devices that successfully address the problem of program disturbance between adjacent memory cells.

According to an aspect of the inventive concept, there is provided a multilevel flash memory device, comprising; a memory cell array comprising a plurality of multilevel (MLC) memory cells respectively connected between a plurality of words lines and a plurality of bits lines, wherein each MLC memory cell is capable of being programmed to an erase state or one of a plurality of standard program states, a status detector configured to detect whether or not a target memory cell is programmed to the erase state, and provide a detection result when the target memory cell is determined to be programmed to the erase state, and a control logic unit configured to receive the detection result and during a programming operation to control a program voltage applied to a neighboring memory cell adjacent to the target memory cell and to be programmed to one of a plurality of standard program states, such that the neighboring memory cell is programmed to a corresponding one of a plurality of correction program states different from the one of the plurality of standard program states.

In one related aspect, each one of the plurality of correction program states has a lower threshold voltage distribution than a corresponding one of the plurality of standard program states.

In another related aspect, the control logic unit is further configured following the programming operation to apply one of a plurality of standard verification voltages respectively corresponding to one of the standard program states to the neighboring memory cell, and following the programming operation and in response to the detection result to apply one of a plurality of correction verification voltages respectively corresponding to one of the correction program states to the neighboring memory cell.

In another related aspect, each one of the plurality of correction verification voltages is less than a corresponding one of the plurality of standard verification voltages.

In another related aspect, the control logic unit is further configured during a read operation to apply one of a plurality of standard read voltages respectively corresponding to one of the standard program states to the neighboring memory cell, and during the read operation and in response to the detection result to apply one of a plurality of correction read voltages respectively corresponding to one of the correction program states to the neighboring memory cell.

In yet another related aspect, each one of the plurality of correction read voltages is less than a corresponding one of the plurality of standard read voltages.

According to another aspect of the inventive concept, there is provided a computational system incorporating the above multilevel flash memory device.

According to another aspect of the inventive concept, there is provided a method of programming a multilevel flash memory device, wherein the flash memory device comprises a memory cell array comprising a plurality of multilevel (MLC) memory cells respectively connected between a plurality of words lines and a plurality of bits lines, wherein each MLC memory cell is capable of being programmed to an erase state or one of a plurality of standard program states. The method comprises; detecting whether or not a target memory cell is programmed to the erase state, and upon detecting that the target memory cell is programmed to the erase state, controlling a program voltage applied to a neighboring memory cell adjacent to the target memory cell and to be programmed to one of a plurality of standard program states, such that the neighboring memory cell is programmed to a corresponding one of a plurality of correction program states different from the one of the plurality of standard program states.

BRIEF DESCRIPTION OF THE DRAWINGS

Embodiment of the inventive concepts of the inventive concept will be more clearly understood from the following detailed description taken in conjunction with the accompanying drawings in which.

DETAILED DESCRIPTION OF THE EMBODIMENTS

Several embodiments of the inventive concept are illustrated in the attached drawings. However, the inventive concept may be variously embodied and should not be construed as being limited to only the illustrated embodiments. Rather, the illustrated embodiments are presented as teaching examples. Throughout the drawings and written description, like reference numbers denote like or similar elements.

Figure 1:
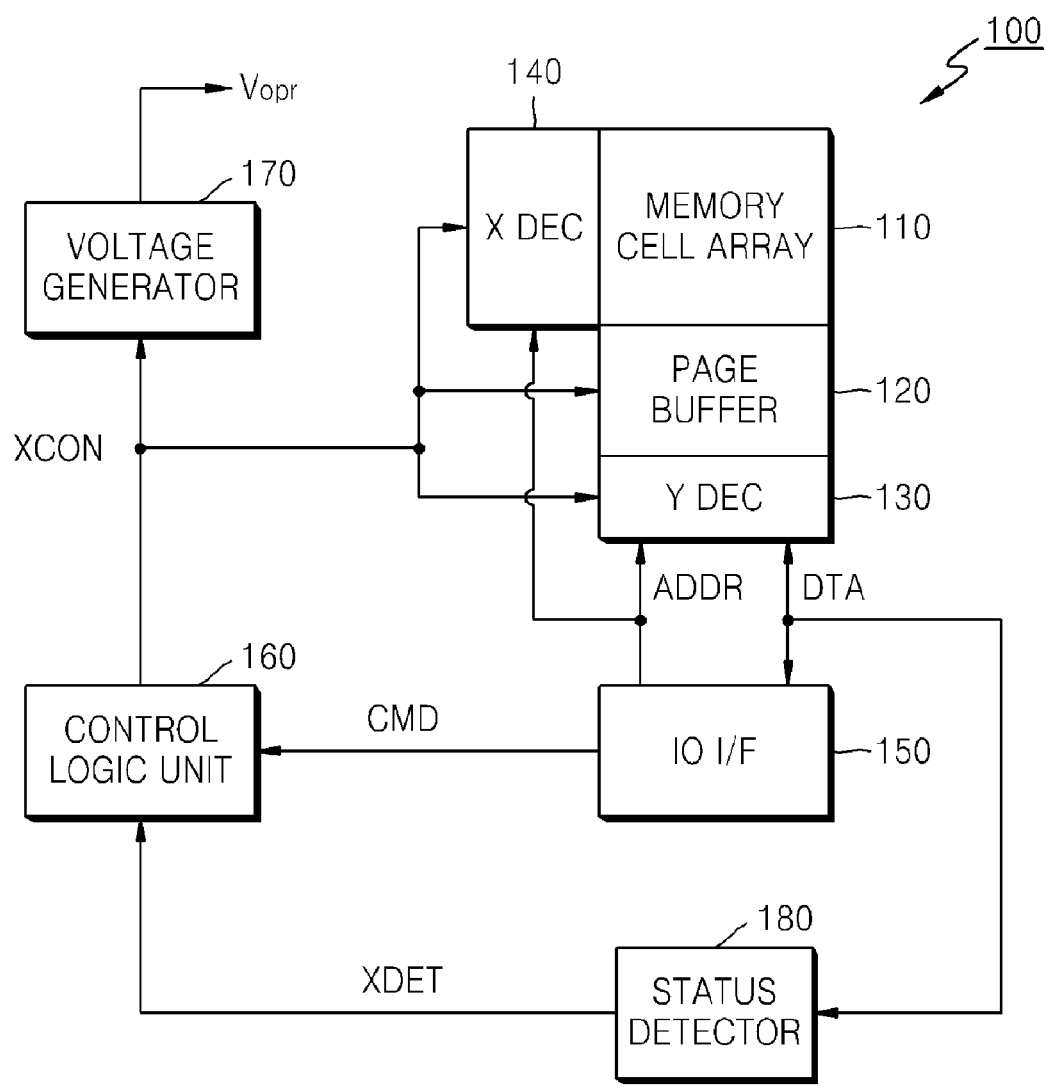
FIG. 1 is a block diagram of a flash memory device according to an embodiment of the inventive concept.

FIG. 1 is a block diagram of a flash memory device 100 according to an embodiment of the inventive concept. The flash memory device 100 comprises a memory cell array 110 including a plurality of memory cells capable of storing data, and a row decoder 140 selecting a word line associated with the memory cell array 110 in response to an address (ADDR) provided through an input/output (I/O) interface 150. The flash memory device 100 also comprises a page buffer 120 capable of storing a page corresponding to the selected word line, and a column decoder 130 selecting a bit line associated with the page buffer 120 in response to the address ADDR and capable of writing (or programming) or reading data (DTA).

The flash memory device 100 also comprises a control logic unit 160 capable of generating a control signal (XCON) that controls the foregoing elements of FIG. 1, and a voltage generator 120 generating and applying an operation voltage (Vopr) in response to the control signal (XCON).

The flash memory device 100 of FIG. 1 is configured to detect the program states of memory cells within the memory cell array 110 and transfer a detection result (XDET) to the control logic unit 160. Although the data (DTA) stored in the page buffer 120 is detected with reference to FIG. 1, since the data (DTA) of the page buffer 120 corresponds to data of the memory cell array 110, both the data (DTA) and the data of the memory cell array 110 are not separated from each other.

The control logic unit 160 controls the voltage controller 120 to adjust a threshold voltage, a verification voltage, and a read voltage according to the program states of memory cells adjacent to a target memory cell (i.e., a memory cell possibly disturbed by a programming operation) having an erase state in response to the detection result (XDET).

This type of programming method will now be described in some additional detail. Although the control logic unit 160 may control the program voltages applied to memory cells adjacent to a target memory cell having a program state other than the erase state, an example assuming an erase state will now be described as a convenient example.

Figure 2:
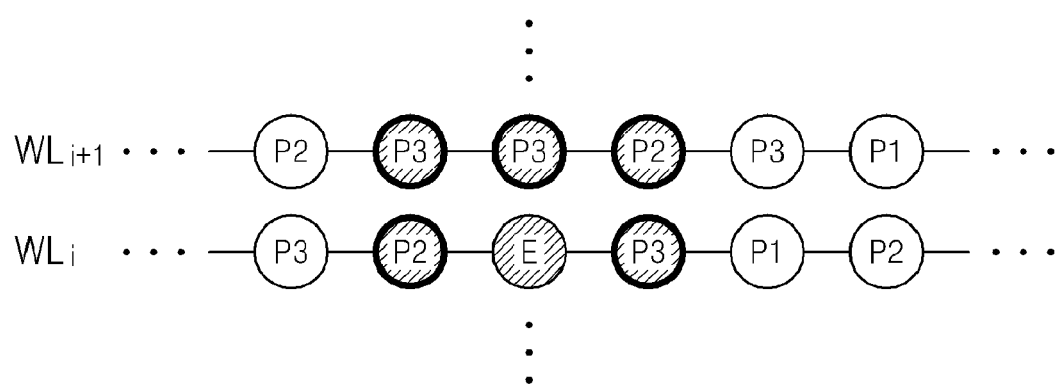
FIG. 2 conceptually illustrates programming states for memory cells within a memory cell array of FIG. 1 according to an embodiment of the inventive concept.

FIG. 2 illustrates program states for "neighboring memory cells" of the memory cell array 110 proximate a target memory cell having an erase state (E) according to an embodiment of the inventive concept.

Referring to FIG. 2, the neighboring memory cells adjacent to the target memory cell may be programmed to have one of first, second, or third states (P1), (P2), and (P3). For descriptive convenience in the working example, it is assumed that the neighboring memory cells do not have the erase state. In this regard, it should be noted that although the erase state may exist in neighboring memory cells adjacent to a target memory cell having the erase state (E), the migration of electrical charge, as will be described hereafter in some additional detail, does not occur to a great degree between the adjacent memory cells having the same state (i.e., both having the erase state). Therefore, those skilled in the art will appreciate that adjacent memory cells (i.e., a target memory cell and a neighboring memory cell) both having the erase state may be handled in a manner similar to what follows.

Figure 3:
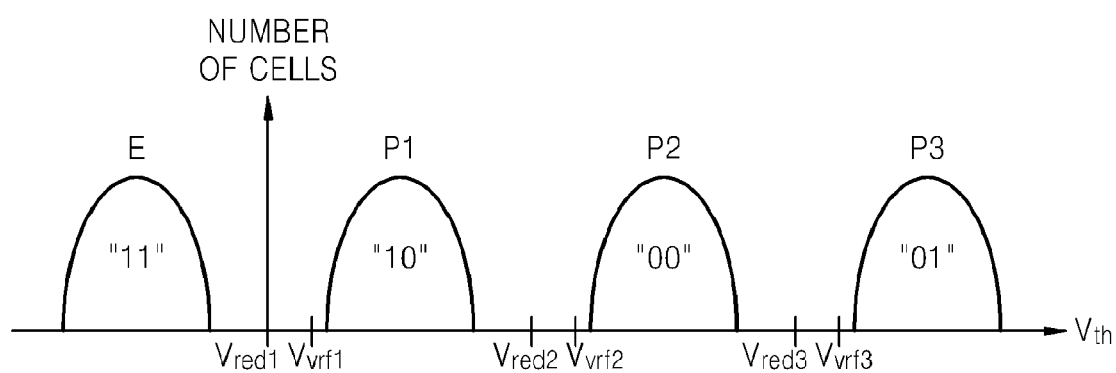
FIG. 3 is a graph illustrating cell threshold voltage distributions associated with program states for a 2-bit multilevel flash memory device according to an embodiment of the inventive concept.
Figure 4:
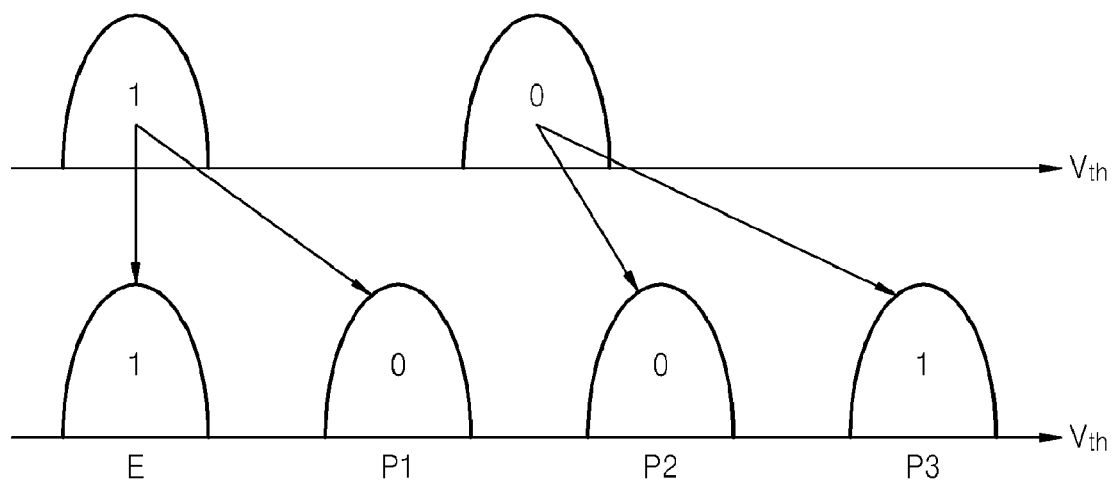
FIG. 4 is a graph illustrating operations associated with the sequential programming of a least significant bit (LSB) page and a most significant bit (MSB) page in a 2-bit multilevel flash memory device according to an embodiment of the inventive concept.

FIG. 3 is a graph illustrating "standard" memory cell threshold voltage distributions associated with the programming states for a 2-bit multilevel flash memory device according to an embodiment of the inventive concept. Referring to FIG. 2, the standard erase state (E) and standard program states (P1), (P2), and (P3) are assigned respective data values of "11", "10", "00", and "01". In the context of the illustrated threshold voltage distributions, the term "standard" is used to distinguish "correction" threshold voltage distributions described hereafter. For example, the 2-bit multilevel flash memory illustrated in FIG. 3 may be programmed in accordance with the "standard states" when a target memory cell is not programmed to the erase state. The 2-bit multilevel flash memory device may form the cell threshold voltage distribution by sequentially programming a least significant bit (LSB) page and a most significant bit (MSB) page.

Referring to FIG. 3, respective and corresponding "standard" verification voltages (e.g., $V_{Vrt}1, V_{Vrt}2, V_{Vrt}3$) may be set to be lower than a voltage level at which the cell threshold voltage distribution for a particular program state begins, such that the flash memory device 100 can verify the respective standard program states for the memory cell. Also, respective and "standard" read voltages (e.g., $V_{red}1, V_{red}2, V_{red}3$) may be set as a voltage between (e.g., half way between) adjacent cell threshold voltage distributions for respective threshold voltage distributions.

With reference to FIG. 2, the target memory cell having the erase state (E) may be disturbed when neighboring memory cells adjacent to the target memory cell are programmed to a desired program state (P1), (P2), and (P3). For example, it is common that the erase state threshold voltage may be shifted higher under the influence of the conventionally occurring program disturb phenomenon. In contradistinction, the threshold voltage distribution of the neighboring memory cells which are programmed to one of the three (3) program states (P1), (P2), and (P3) may be shifted lower, or may be broadened under the influence of the program disturb phenomenon.

When the neighboring memory cells have "shifted" threshold voltage distributions, the flash memory device 100 may provide erroneous data during a subsequent read operation. Therefore, the respective verification voltage(s) and/or the read voltage(s) are different from those shown in FIG. 3 when a flash memory device according to an embodiment of the inventive concept verifies and reads the program states of the neighboring memory cells adjacent to a target memory cell having the erase state.

Hereinafter, the certain memory cell threshold voltage distributions for neighboring memory cells programmed to various program states (i.e., states other than the erase state) will be described in some additional detail.

Figure 5A:
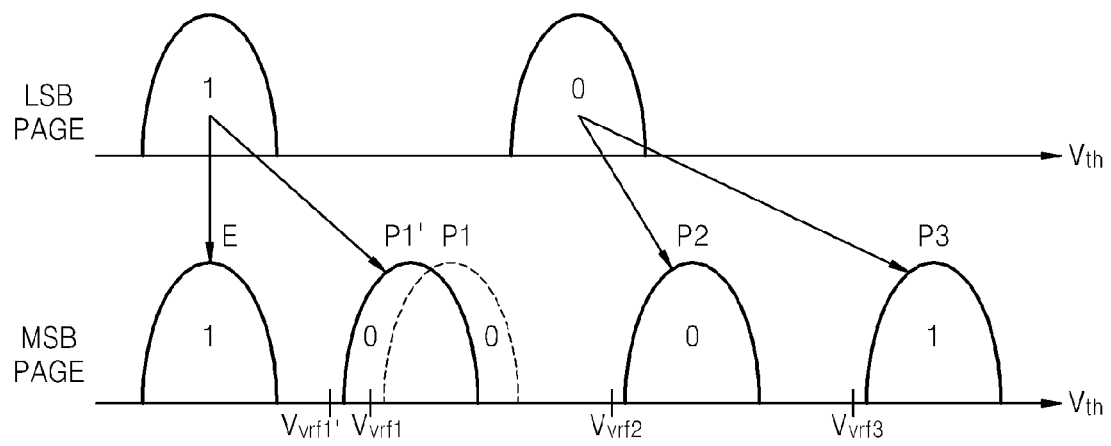
FIGS. 5A through 11B are graphs illustrating cell threshold voltage distributions associated with program states for memory cells adjacent to a target memory cell having an erase state within the flash memory device of FIG. 1 according to various embodiments of the inventive concept.
Figure 5B:
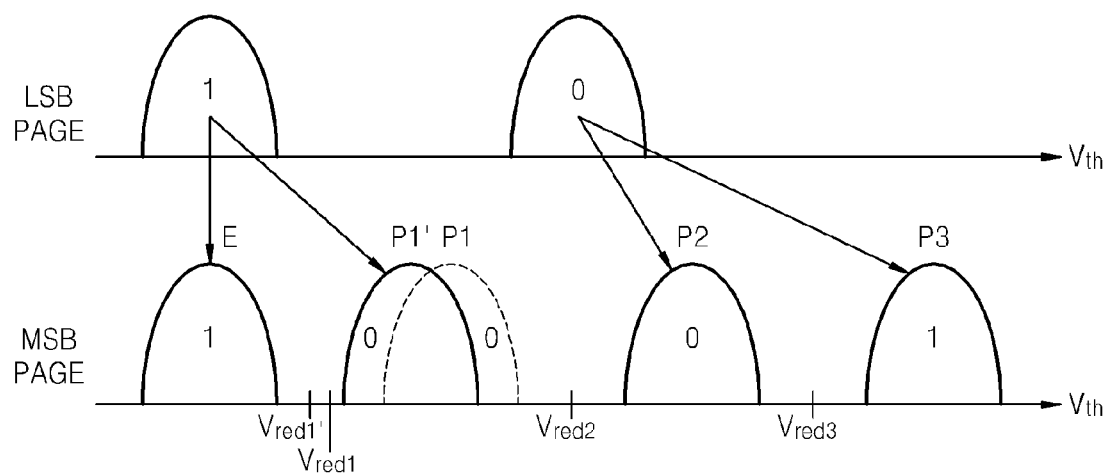

For example, FIGS. 5A and 5B are graphs illustrating memory cell threshold voltage distributions with respect to program states for neighboring memory cells adjacent to a target memory cell having an erase state within the flash memory device 100 of FIG. 1 according to an embodiment of the inventive concept.

Referring collectively to FIGS. 1, 5A, and 5B, if a status detector 180 detects a target memory cell having the erase state (E), the control logic unit 160 may adjust a program voltage applied to a memory cell, such that the memory cell to be programmed to the first program state (P1) among the neighboring memory cells is initially programmed to a first correction program state (P1'). Referring to the specific example illustrated in FIG. 5A, a voltage distribution associated with the first correction program state (P1') may be lower than the voltage distribution associated with the first program state (P1).

In this regard, referring to FIG. 5A, the control logic unit 160 may perform a verification operation using a first correction verification voltage Vvrf1' different from the first verification voltage Vvrf1 with regard to the memory cell programmed to the first correction program state (P1'). The first correction verification voltage Vvrf1' in the illustrated example of FIG. 5A is less than the first verification voltage Vvrf1.

Likewise, referring to FIG. 5B, the control logic unit 160 may perform a read operation at a first correction read voltage Vred1' different from the first read voltage Vred1 with respect to the memory cell programmed to have the first correction program state (P1'). In the illustrated example of FIG. 5B, the first correction read voltage Vred1' is less than the first read voltage Vred1.

Although the second read voltage Vred2 is not adjusted with respect to the second program state (P2) in the example of FIG. 5B, the second read voltage Vred2 may be set to have a value half way between the voltage distributions associated with the first correction program state (P1') and the second program state (P2).

Figure 6A:
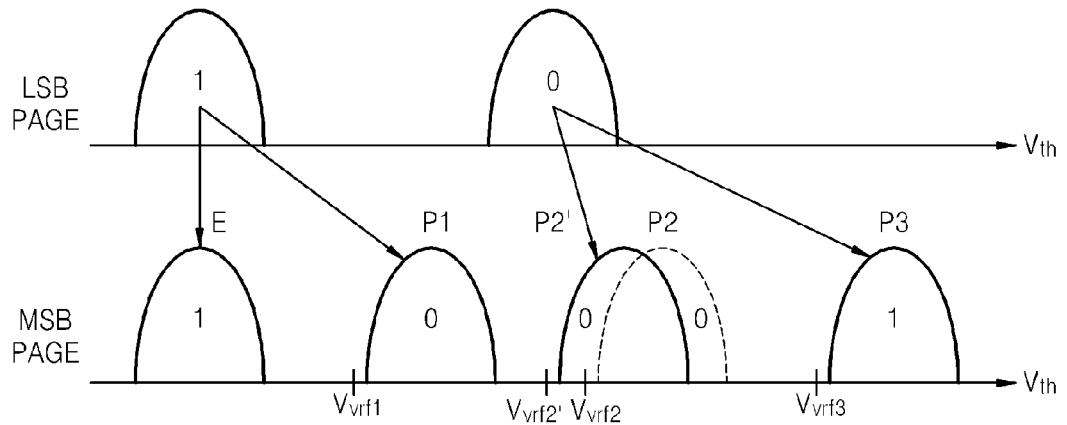
Figure 6B:
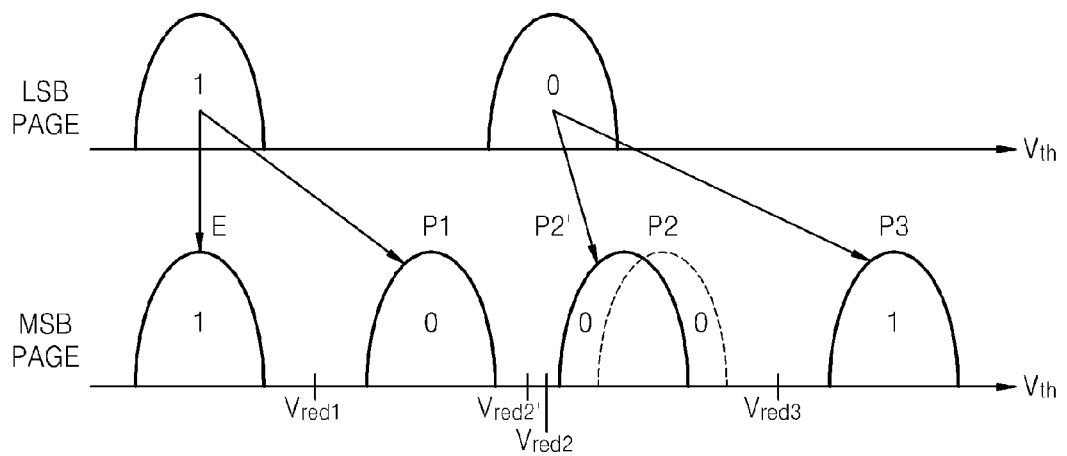

FIGS. 6A and 6B are graphs illustrating cell threshold voltage distributions with respect to program states of neighboring memory cells adjacent to a target memory cell having an erase state within the flash memory device 100 of FIG. 1.

Referring collectively to FIGS. 1, 6A, and 6B, if the status detector 180 detects the target memory cell having the erase state (E), the control logic unit 160 may adjust a program voltage applied to a memory cell such that the memory cell to be programmed to have the second program state (P2) among the neighboring memory cells is programmed to have a second correction program state (P2'). Referring to FIG. 6A, a voltage distribution with respect to the second correction program state (P2') may be formed at a voltage region lower than that with respect to the second program state (P2).

In this regard, referring to FIG. 6A, the control logic unit 160 may perform a verification operation at a second correction verification voltage Vvrf2' different from the second verification voltage Vvrf2 with regard to the memory cell programmed to have the second correction program state (P2'). In the illustrated example of FIG. 6A, the second correction verification voltage Vvrf2' is less than the second verification voltage Vvrf2.

Likewise, referring to FIG. 6B, the control logic unit 160 may perform a read operation using a second correction read voltage Vred2' different from the second read voltage Vred2 with respect to the memory cell programmed to have the second correction program state (P2'). In the illustrated embodiment of FIG. 6B, the second correction read voltage Vred2' is less than the second read voltage Vred2.

Although the third read voltage Vred3 is not adjusted with respect to the third program state (P3) with reference to FIG. 6B, the third read voltage Vred3 may be set half way between the voltage distributions with respect to the second correction program state (P2') and the third program state (P3).

Figure 7A:
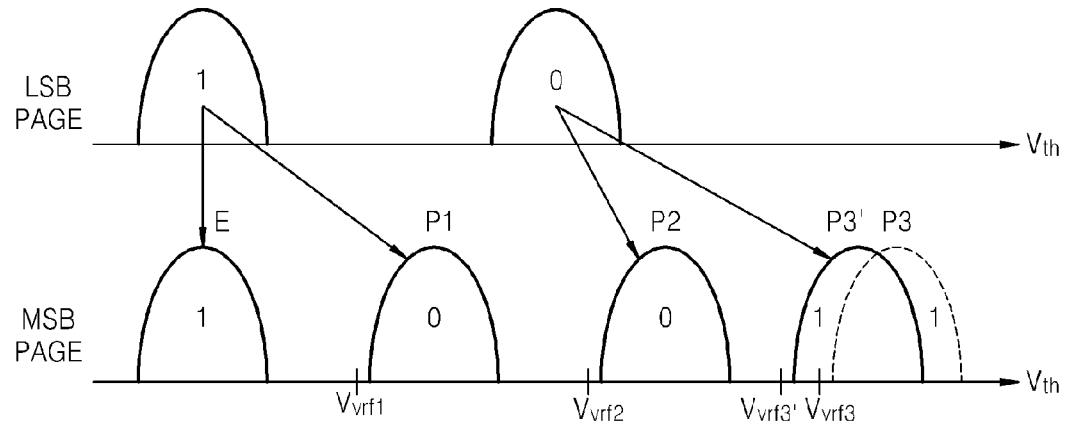
Figure 7B:
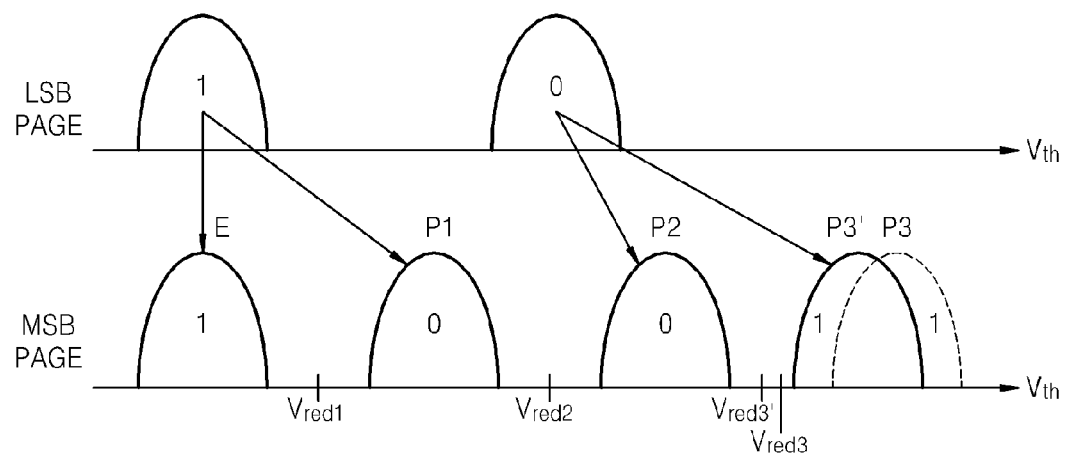

FIGS. 7A and 7B are graphs illustrating cell threshold voltage distributions with respect to program states for neighboring memory cells adjacent to a target memory cell having an erase state within the flash memory device 100 according to another embodiment of the inventive concept.

Referring collectively to FIGS. 1, 7A, and 7B, if the status detector 180 detects the memory cell having the erase state E, the control logic unit 160 may adjust a program voltage applied to a memory cell so that the memory cell to be programmed to the third program state (P3) among the neighboring memory cells adjacent to the target memory cell having the erase state (E) is programmed to have a third correction program state (P3'). Referring to FIG. 7A, the voltage distribution with respect to the third correction program state (P3') may be formed at a voltage region less than that with respect to the third program state (P3).

In this regard, referring to FIG. 7A, the control logic unit 160 may perform a verification operation at a third correction verification voltage Vvrf3' different than a third verification voltage Vvrf3 with regard to the memory cell programmed to have the third correction program state (P3)'. In the illustrated example of FIG. 7A, the third correction verification voltage Vvrf3' is less than the third verification voltage Vvrf3.

Likewise, referring to FIG. 7B, the control logic unit 160 may perform a read operation at a third correction read voltage Vred3' different than a third read voltage Vred3 with respect to the memory cell programmed to have the third correction program state (P3'). In this regard, the third correction read voltage Vred3' is less than the third read voltage Vred3.

As described above, the flash memory device and method of programming/reading the flash memory device according to embodiments of the inventive concept, establish an additional program state with regard to neighboring memory cells adjacent to a target memory cell having an erase state and establish verification and read voltages corresponding to the program state, thereby increasing reliability of the programming and reading operations of the flash memory device.

Figure 8A:
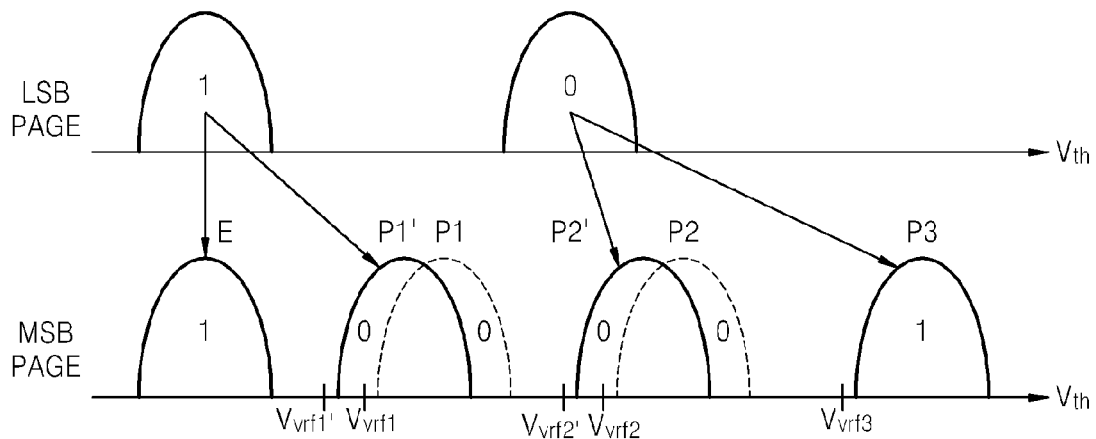
Figure 8B:
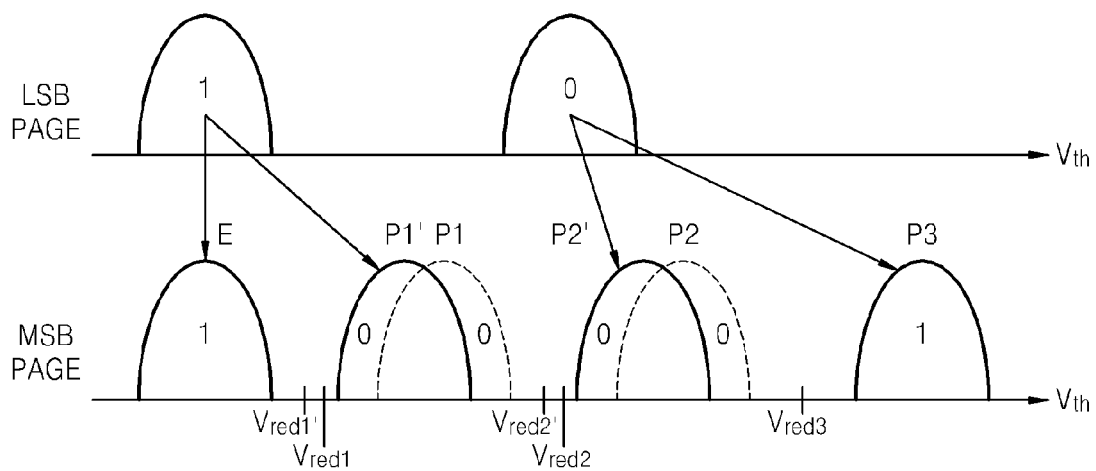

FIGS. 8A and 8B are graphs illustrating cell threshold voltage distributions with respect to program states of neighboring memory cells adjacent to a target memory cell having an erase state within the flash memory device 100 of FIG. 1 according to another embodiment of the inventive concept.

Referring collectively to FIGS. 1, 8A, and 8B, if the status detector 180 detects the memory cell having the erase state E, the control logic unit 160 may adjust a program voltage applied to a memory cell so that the memory cell to be programmed to have the first program state (P1) among the neighboring memory cells adjacent to the target memory cell having the erase state (E) is programmed to have the first correction program state (P1'). The control logic unit 160 may adjust the program voltage that is applied to the memory cell so that the memory cell that is to be programmed to have the second program state (P2) among the memory cells adjacent to the memory cell having the erase state (E) is programmed to have the second correction program state (P2'). A voltage distribution with respect to the first correction program state (P1') may be formed at a voltage region lower than that with respect to the first program state (P1). A voltage distribution with respect to the second correction program state (P2') may be formed at a voltage region lower than that with respect to the second program state (P2).

In this regard, referring to FIG. 8A, the control logic unit 160 may perform a verification operation at the first correction verification voltage Vvrf1' different from the first verification voltage Vvrf1 with regard to the memory cell programmed to have the first correction program state (P1)'. The control logic unit 160 may perform the verification operation at the second correction verification voltage Vvrf2' other than the second verification voltage Vvrf2 with regard to the memory cell programmed to have the second correction program state (P2'). The first correction verification voltage Vvrf1' may be lower than the first verification voltage Vvrf1. The second correction verification voltage Vvrf2' may be lower than the second verification voltage Vvrf2.

Likewise, referring to FIG. 8B, the control logic unit 160 may perform a read operation at the first correction read voltage Vred1' different from the first read voltage Vred1 with respect to the memory cell programmed to have the first correction program state (P1'). The control logic unit 160 may perform the read operation at the second correction read voltage Vred2' different from the second read voltage Vred2 with respect to the memory cell programmed to have the second correction program state (P2'). In this regard, the first correction read voltage Vred1' may be lower than the first read voltage Vred1. The second correction read voltage Vred2' may be lower than the second read voltage Vred2.

Although the third read voltage Vred3 is not adjusted with respect to the third program state (P3) with reference to FIG. 8B, the third read voltage Vred3 may be established as a value in the middle of voltage distributions with respect to the second correction program state (P2') and the third program state (P3).

Figure 9A:
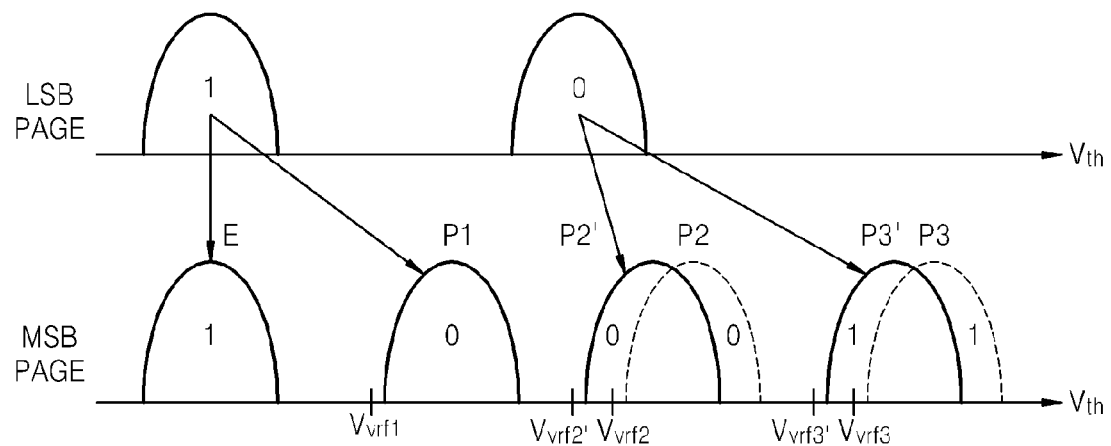
Figure 9B:
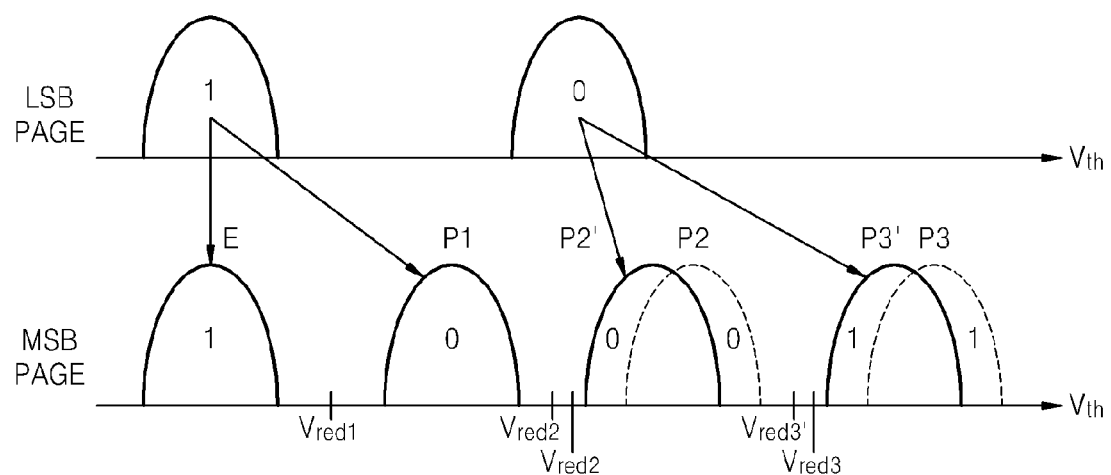

FIGS. 9A and 9B are graphs illustrating cell threshold voltage distributions with respect to program states for neighboring memory cells adjacent to a target memory cell having an erase state within the flash memory device 100 of FIG. 1 according to another embodiment of the inventive concept.

Referring collectively to FIGS. 1, 9A, and 9B, if the status detector 180 detects a memory cell having the erase state (E), the control logic unit 160 may adjust a program voltage applied to a neighboring memory cell such that the memory cell to be programmed to have the second program state (P2) among the neighboring memory cells adjacent to the target memory cell having the erase state (E) is programmed to have the second correction program state (P2'). The control logic unit 160 may adjust the program voltage that is applied to the memory cell so that the memory cell that is to be programmed to have the third program state (P3) among the memory cells adjacent to the memory cell having the erase state (E) is programmed to have the third correction program state (P3'). A voltage distribution with respect to the second correction program state (P2') may be formed at a voltage region lower than that with respect to the second program state (P2). A voltage distribution with respect to the third correction program state (P3') may be formed at a voltage region lower than the third program state (P3).

In this regard, referring to FIG. 9A, the control logic unit 160 may perform a verification operation at the second correction verification voltage Vvrf2' different from the second verification voltage Vvrf2 with regard to the memory cell programmed to have the second correction program state (P2'). The control logic unit 160 may perform the verification operation at the third correction verification voltage Vvrf3' other than the third verification voltage Vvrf3 with regard to the memory cell programmed to have the third correction program state (P3'). The second correction verification voltage Vvrf2' may be lower than the second verification voltage Vvrf2. The third correction verification voltage Vvrf3' may be lower than the third verification voltage Vvrf3.

Likewise, referring to FIG. 9B, the control logic unit 160 may perform a read operation at the second correction read voltage Vred2' other than the second read voltage Vred2 with respect to the memory cell programmed to have the second correction program state (P2'). The control logic unit 160 may perform the read operation at the third correction read voltage Vred3' other than the third read voltage Vred3 with respect to the memory cell programmed to have the third correction program state (P3'). In this regard, the second correction read voltage Vred2' may be lower than the second read voltage Vred2. The third correction read voltage Vred3' may be lower than the third read voltage Vred3.

Figure 10A:
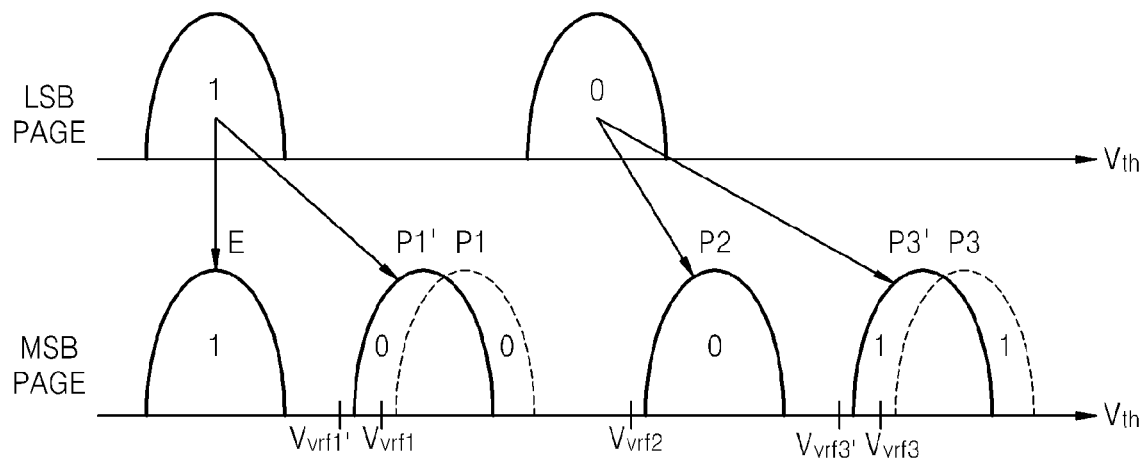
Figure 10B:
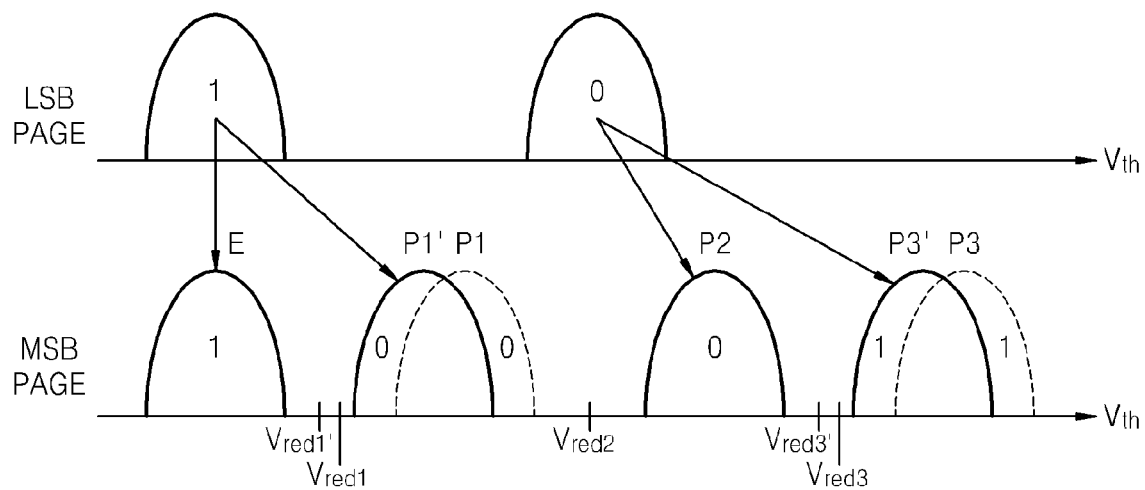

FIGS. 10A and 10B are graphs illustrating cell threshold voltage distributions with respect to program states for neighboring memory cells adjacent to a target memory cell having an erase state within the flash memory device 100 of FIG. 1 according to another embodiment of the inventive concept.

Referring collectively to FIGS. 1, 10A, and 10B, if the status detector 180 detects the memory cell having the erase state (E), the control logic unit 160 may adjust a program voltage that is applied to the memory cell so that a memory cell that is to be programmed to have the first program state (P1) among the memory cells adjacent to the memory cell having the erase state (E) is programmed to have the first correction program state (P1'). The control logic unit 160 may adjust the program voltage that is applied to the memory cell so that the memory cell that is to be programmed to have the third program state (P3) among the memory cells adjacent to the memory cell having the erase state (E) is programmed to have the third correction program state (P3'). A voltage distribution with respect to the first correction program state (P1') may be formed at a voltage region lower than that with respect to the first program state (P1). A voltage distribution with respect to the third correction program state (P3') may be formed at a voltage region lower than the third program state (P3).

In this regard, referring to FIG. 10A, the control logic unit 160 may perform a verification operation at the first correction verification voltage Vvrf1' other than the first verification voltage Vvrf1 with regard to the memory cell programmed to have the first correction program state (P1'). The control logic unit 160 may perform the verification operation at the third correction verification voltage Vvrf3' other than the third verification voltage Vvrf3 with regard to the memory cell programmed to have the third correction program state (P3'). The first correction verification voltage Vvrf1' may be lower than the first verification voltage Vvrf1. The third correction verification voltage Vvrf3' may be lower than the third verification voltage Vvrf3.

Likewise, referring to FIG. 10B, the control logic unit 160 may perform a read operation at the first correction read voltage Vred1' other than the first read voltage Vred1 with respect to the memory cell programmed to have the first correction program state (P1)'. The control logic unit 160 may perform the read operation at the third correction read voltage Vred3' other than the third read voltage Vred3 with respect to the memory cell programmed to have the third correction program state (P3'). In this regard, the third correction read voltage Vred1' may be lower than the first read voltage Vred1. The third correction read voltage Vred3' may be lower than the third read voltage Vred3.

Although the second read voltage Vred2 is not adjusted with respect to the second program state (P2) with reference to FIG. 10B, the second read voltage Vred2 may be established as a value in the middle of voltage distributions with respect to the first correction program state (P1') and the second program state (P2).

As described above, flash memory devices and/or methods of programming/reading a flash memory device according to various embodiments of the inventive concept establish one or more additional program states with regard to neighboring memory cells adjacent to a target memory cell having an erase state, and establish verification and read voltages corresponding to the additional program state(s), thereby increasing the reliability of the programming and reading operations of the flash memory device.

Figure 11A:
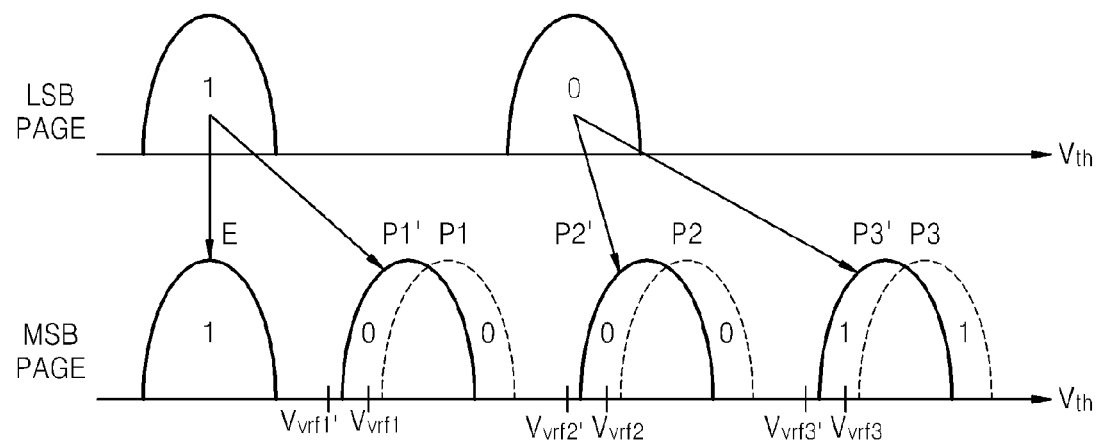
Figure 11B:
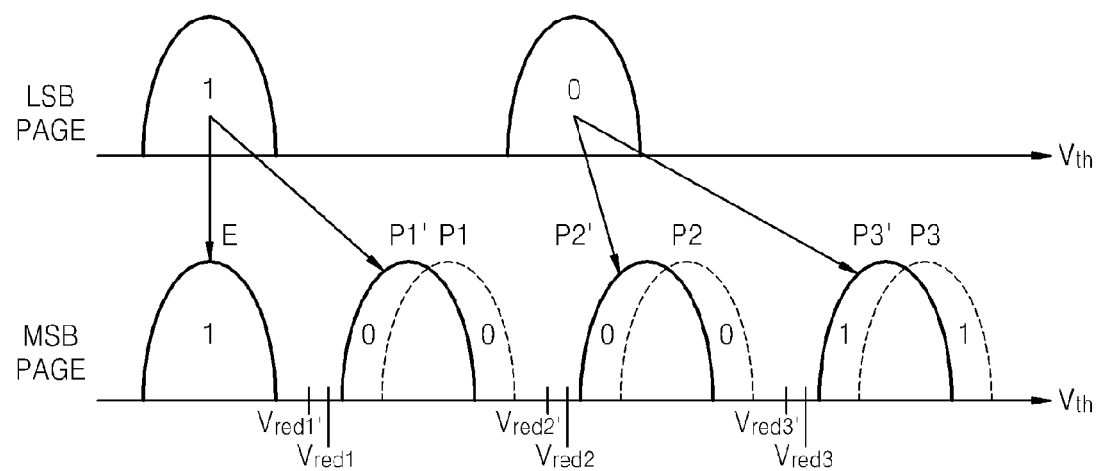

FIGS. 11A and 11B are graphs illustrating cell threshold voltage distributions with respect to program states for neighboring memory cells adjacent to a target memory cell having an erase state within the flash memory device 100 of FIG. 1 according to another embodiment of the inventive concept.

Referring to FIGS. 1, 11A, and 11B, if the status detector 180 detects the memory cell having the erase state (E), the control logic unit 160 may adjust a program voltage that is applied to the memory cell so that memory cells that are to be programmed to have the first through third program states (P1) through (P3) among the memory cells adjacent to the memory cell having the erase state (E) are programmed to have the first through third correction program states (P1') through (P3'). Voltage distributions with respect to the first through third correction program states (P1') through (P3') may be formed at voltage regions lower than those with respect to the corresponding program states.

In this regard, referring to FIG. 11A, the control logic unit 160 may perform a verification operation at a corresponding voltage between the first through third correction verification voltages Vvrf1' through Vvrf3' different from the first through third verification voltages Vvrf1 through Vvrf3 with regard to the memory cells programmed to have the first through third correction program states (P1') through (P3'). The first through third correction verification voltages Vvrf1' through Vvrf3' may be lower than the corresponding verification voltages.

Likewise, referring to FIG. 11B, the control logic unit 160 may perform a read operation at a corresponding voltage between the first through third correction read voltages Vred1' through Vred3' other than the first through third read voltages Vred1 through Vred3 with regard to the memory cells programmed to have the first through third correction program states (P1') through (P3'). The first through third correction read voltages Vred1' through Vred3' may be lower than the corresponding read voltages.

As described above, the flash memory device and method of programming and reading the flash memory device, according to the inventive concept, establish additional three program states with regard to memory cells adjacent to a memory cell having an erase state and establish verification and read voltages corresponding to the three program states, thereby increasing reliability of the programming and reading operations of the flash memory device.

The operation of the 2-bit multilevel flash memory device has been described above. However, the inventive concept is not limited thereto and 3 or more bit multilevel flash memory devices may be applied to the technical idea of the inventive concept. For example, a 3-bit multilevel flash memory device having an erase state and first through seventh program states may be programmed to have an additional eighth program state with regard to a memory cell adjacent to a memory cell having the erase state. Those skilled in the art will understand that there are various methods of programming/reading a flash memory device having multi-level memory cells storing 3 or more data bits.

Further, additional embodiments of the inventive concept may be applied to memory devices including memory cells other than flash memory cells, such as PRAM, MRAM, FeRAM, DRAM, and the like.

Figure 12:
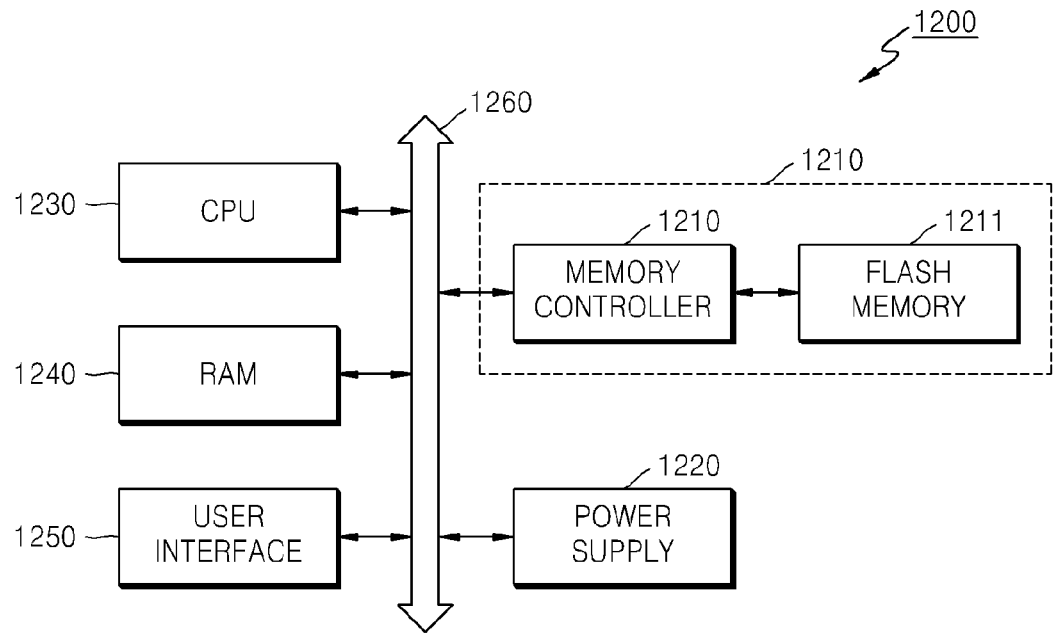
FIG. 12 is a block diagram of a computational system incorporating a flash memory device according to an embodiment of the inventive concept.

FIG. 12 is a block diagram of a computational system 1200 incorporating a flash memory device according to an embodiment of the inventive concept.

Referring to FIG. 12, the computational system 1200 comprises a microprocessor 1230 that is electrically connected to a bus 1260, a user interface 1250, and a memory system device 1210 including a memory controller 121 and a flash memory device 1211. N-bit data, where N is a natural number, that has been processed and is to be processed will be stored in the flash memory device 1211 by the microprocessor 1230 through the memory controller 1212. The computational system 1200 further comprises a RAM 1240 and a power supply device 1220.

If the computational system 1200 is a mobile device, a battery and a modem such as a baseband chipset may be additionally included in the mobile device to supply an operational voltage of a computing system. Also, it would be obvious to one of ordinary skill in the art that an application chipset, a camera image processor (CIS), a mobile DRAM, and the like may be included in the computational system 1200 and thus a detailed description thereof will not be given here.

The memory controller 1212 and the flash memory device 1211 may include, for example, a solid state drive/disk (SSD) that uses a non-volatile memory for storing data.

Figure 13:
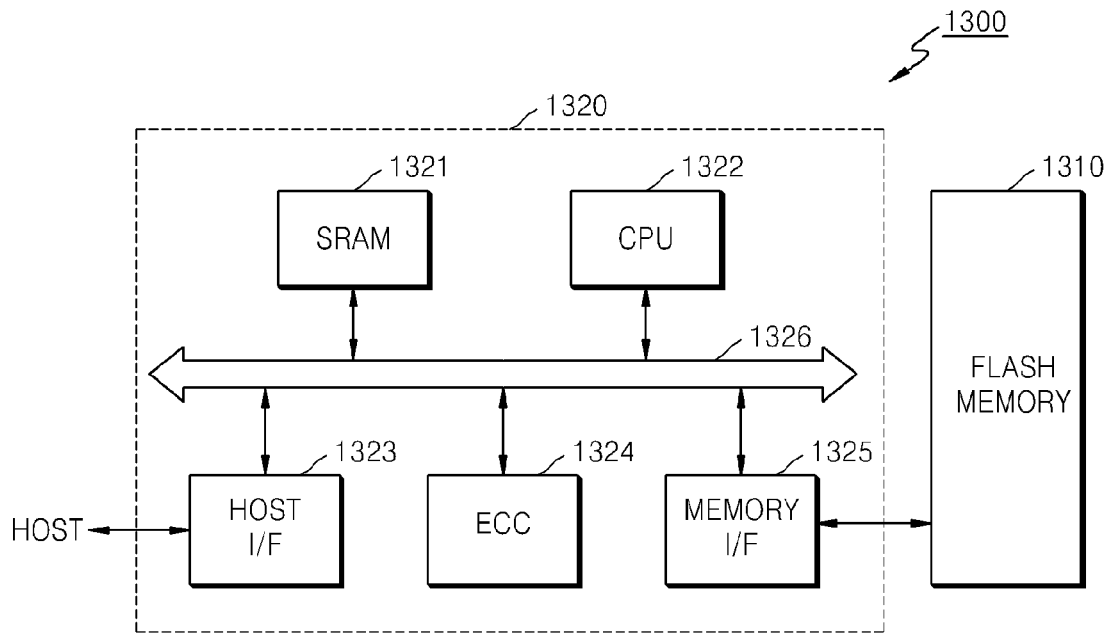
FIG. 13 is a block diagram of a memory card incorporating a flash memory device according to an embodiment of the inventive concept.

Referring to FIG. 13, a memory card 1300 includes a flash memory device 1310 and the memory controller 1320. In this case, the memory controller 1320 may communicate with the outside (e.g., a host) through one of various interface protocols such as USB, MMC, PCI-E, SATA, PATA, SCSI, ESDI, IDE, and the like. The structures and operations of a CPU 1322, SRAM 1321, HOST I/F 1323, ECC 1324, MEMORY I/F 1325, and a bus 1326 included in the memory controller 1320 would be obvious to one of ordinary skill in the art and thus detailed descriptions thereof will not be given here.

The flash memory device 1310 may be mounted by using variously shaped packages. For example, the flash memory device 1310 may be mounted by using packages such as a PoP (Package on Package), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP), and the like.

For example, the flash memory device 100 shown in FIG. 1 uses the status detector 180 and the control logic unit 160 to detect a memory cell having an erase state and control voltages applied to memory cells adjacent to the memory cell having the erase state, respectively, but the inventive concept is not limited thereto. The memory controller 1210 shown in FIG. 12 may detect the memory cell having the erase state and control voltages applied to memory cells adjacent to the memory cell having the erase state.

The memory cells adjacent to the memory cell having the erase state may have different program states, but the inventive concept is not limited thereto. Referring to FIG. 14, a specific data pattern may be programmed to have a program state (an $N^{th}$ program state) other than the erase state and the first program state through an $N-1^{st}$ program state. In this regard, the specific data pattern may be a frequently and repeatedly programmed data value.

Figure 14A:
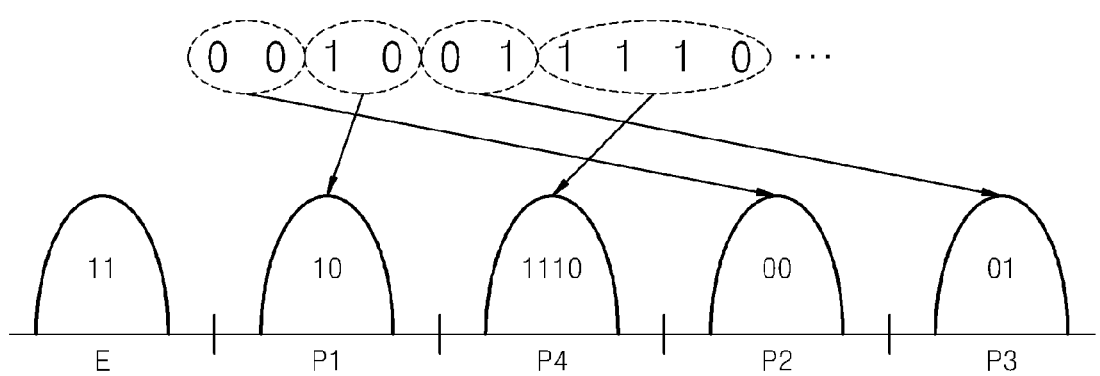
FIGS. 14A and 14B are graphs illustrating a programming method in combination with data compression according to embodiments of the inventive concept.
Figure 14B:
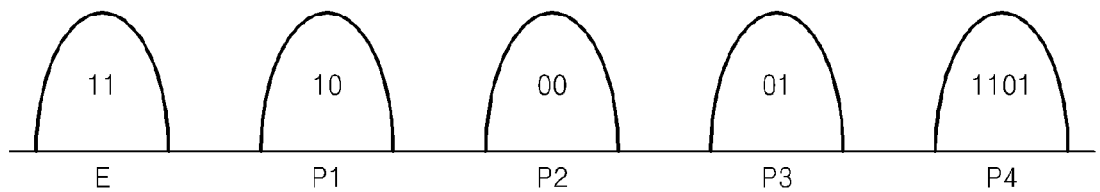

For example, referring to FIG. 14A, in a 2-bit multilevel flash memory device including an erase state and first through third program states (P1) through (P3), if a data pattern "1110" is frequently and repeatedly programmed, the data pattern "1110" may be programmed to have a fourth program state P4. In this regard, the control logic unit 160 may control detection of a specific data pattern from data that is to be programmed and apply a program voltage corresponding to the specific data pattern to a memory cell. Likewise, referring to FIG. 14B, if data "1101" is frequently repeated in the 2-bit multilevel flash memory device, the data "1101" is established as a specific data pattern and may be programmed to have the fourth program state P4.

The control logic unit 160 may determine the specific data pattern from the data to be programmed and receive information about the specific data pattern from an external interface such as a host. The specific data pattern may be recorded in a specific area of a memory cell array. Furthermore, referring to FIG. 14A, the $N^{th}$ program state may be any status between the erase state and program states adjacent to the first program state through an $N-1^{st}$ program state, and referring to FIG. 14B, the $N^{th}$ program state may be any status higher than the $N^{th}$ program state.

A programming method according to an embodiment of the inventive concept programs a plurality data bits that are to be programmed to have a plurality of cells in a single cell having the $N^{th}$ program state, thereby compressing the data.

While the inventive concept has been particularly shown and described with reference to embodiment of the inventive concepts thereof, it will be understood that various changes in form and details may be made therein without departing from the scope of the following claims.

What is claimed is:

1. A multilevel flash memory device, comprising:
a memory cell array comprising a plurality of multilevel (MLC) memory cells respectively connected between a plurality of words lines and a plurality of bits lines, wherein each MLC memory cell is capable of being programmed to an erase state or one of a plurality of standard program states;
a status detector configured to detect whether or not a target memory cell is programmed to the erase state, and provide a detection result when the target memory cell is determined to be programmed to the erase state; and
a control logic unit configured to receive the detection result and during a programming operation to control a program voltage applied to a neighboring memory cell adjacent to the target memory cell and to be programmed to one of a plurality of standard program states, such that the neighboring memory cell is programmed to a corresponding one of a plurality of correction program states different from the one of the plurality of standard program states.

2. The multilevel flash memory device of claim 1, wherein each one of the plurality of correction program states has a lower threshold voltage distribution than a corresponding one of the plurality of standard program states.

3. The multilevel flash memory device of claim 1, wherein the control logic unit is further configured following the programming operation to apply one of a plurality of standard verification voltages respectively corresponding to one of the standard program states to the neighboring memory cell; and
following the programming operation and in response to the detection result to apply one of a plurality of correction verification voltages respectively corresponding to one of the correction program states to the neighboring memory cell.

4. The multilevel flash memory device of claim 3, wherein each one of the plurality of correction verification voltages is less than a corresponding one of the plurality of standard verification voltages.

5. The multilevel flash memory device of claim 1, wherein the control logic unit is further configured during a read operation to apply one of a plurality of standard read voltages respectively corresponding to one of the standard program states to the neighboring memory cell; and
during the read operation and in response to the detection result to apply one of a plurality of correction read voltages respectively corresponding to one of the correction program states to the neighboring memory cell.

6. The multilevel flash memory device of claim 5, wherein each one of the plurality of correction read voltages is less than a corresponding one of the plurality of standard read voltages.

7. The multilevel flash memory device of claim 1, wherein the programming operation comprises sequentially programming a least significant bit (LSB) page and then programming a most significant bit (MSB) page.

8. A system comprising:
a memory controller configured to control a programming operation and a read operation directed to a multilevel flash memory device; and
a multilevel flash memory device, comprising:
a memory cell array comprising a plurality of multilevel (MLC) memory cells respectively connected between a plurality of words lines and a plurality of bits lines, wherein each MLC memory cell is capable of being programmed to an erase state or one of a plurality of standard program states;
a status detector configured to detect whether or not a target memory cell is programmed to the erase state, and provide a detection result when the target memory cell is determined to be programmed to the erase state; and
a control logic unit configured to receive the detection result and during a programming operation to control a program voltage applied to a neighboring memory cell adjacent to the target memory cell and to be programmed to one of a plurality of standard program states, such that the neighboring memory cell is programmed to a corresponding one of a plurality of correction program states different from the one of the plurality of standard program states.

9. The system of claim 8, wherein each one of the plurality of correction program states has a lower threshold voltage distribution than a corresponding one of the plurality of standard program states.

10. The system of claim 8, wherein the control logic unit is further configured following the programming operation to apply one of a plurality of standard verification voltages respectively corresponding to one of the standard program states to the neighboring memory cell; and
following the programming operation and in response to the detection result to apply one of a plurality of correction verification voltages respectively corresponding to one of the correction program states to the neighboring memory cell.

11. The system of claim 10, wherein each one of the plurality of correction verification voltages is less than a corresponding one of the plurality of standard verification voltages.

12. The system of claim 8, wherein the control logic unit is further configured during a read operation to apply one of a plurality of standard read voltages respectively corresponding to one of the standard program states to the neighboring memory cell; and during the read operation and in response to the detection result to apply one of a plurality of correction read voltages respectively corresponding to one of the correction program states to the neighboring memory cell.

13. The system of claim 12, wherein each one of the plurality of correction read voltages is less than a corresponding one of the plurality of standard read voltages.

14. The system of claim 8, wherein the programming operation comprises sequentially programming a least significant bit (LSB) page and then programming a most significant bit (MSB) page.

15. A method of programming a multilevel flash memory device, wherein the flash memory device comprises a memory cell array comprising a plurality of multilevel (MLC) memory cells respectively connected between a plurality of words lines and a plurality of bits lines, wherein each MLC memory cell is capable of being programmed to an erase state or one of a plurality of standard program states, and the method comprises:

detecting whether or not a target memory cell is programmed to the erase state;

upon detecting that the target memory cell is programmed to the erase state, controlling a program voltage applied to a neighboring memory cell adjacent to the target memory cell and to be programmed to one of a plurality of standard program states, such that the neighboring memory cell is programmed to a corresponding one of a plurality of correction program states different from the one of the plurality of standard program states.

16. The method of claim 15, wherein each one of the plurality of correction program states has a lower threshold voltage distribution than a corresponding one of the plurality of standard program states.

17. The method of claim 15, further comprising:

applying one of a plurality of standard verification voltages respectively corresponding to one of the standard program states to the neighboring memory cell when the target memory cell is not programmed to the erase state; and applying one of a plurality of correction verification voltages respectively corresponding to one of the correction program states to the neighboring memory cell when the target memory cell is programmed to the erase state.

18. The method of claim 17, wherein each one of the plurality of correction verification voltages is less than a corresponding one of the plurality of standard verification voltages.

19. The method of claim 15, further comprising:

applying one of a plurality of standard read voltages respectively corresponding to one of the standard program states to the neighboring memory cell when the target memory cell is not programmed to the erase state; and applying one of a plurality of correction read voltages respectively corresponding to one of the correction program states to the neighboring memory cell when the target memory cell is not programmed to the erase state.

20. The method of claim 19, wherein each one of the plurality of correction read voltages is less than a corresponding one of the plurality of standard read voltages.

* * * * *